(12) United States Patent
Yang

(10) Patent No.: US 7,122,911 B2
(45) Date of Patent: Oct. 17, 2006

(54) HEAT SPREADER AND SEMICONDUCTOR DEVICE PACKAGE HAVING THE SAME

(75) Inventor: Yaw-Yuh Yang, Tainan (TW)

(73) Assignee: Advanced Semiconductor Engineering, Inc., (TW)

( * ) Notice: Subject to any disclaimer, the term of this patent is extended or adjusted under 35 U.S.C. 154(b) by 0 days.

(21) Appl. No.: 10/991,300

(22) Filed: Nov. 17, 2004

(65) Prior Publication Data

US 2005/0104201 A1 May 19, 2005

(30) Foreign Application Priority Data

Nov. 18, 2003 (TW) .............................. 92132289 A

(51) Int. Cl.
*H01L 23/28* (2006.01)
(52) U.S. Cl. ..................... 257/796; 257/706; 257/707
(58) Field of Classification Search ................ 257/706, 257/707, 796
See application file for complete search history.

(56) References Cited

U.S. PATENT DOCUMENTS 5,289,039 A * 2/1994 Ishida et al. ................ 257/796
5,977,626 A * 11/1999 Wang et al. ................. 257/707
2002/0020926 A1* 2/2002 Liu et al. ..................... 257/780

FOREIGN PATENT DOCUMENTS

TW        91100093        7/1991

OTHER PUBLICATIONS

English Abstract of Taiwan 91100093 dated Jul. 1, 1991.

* cited by examiner

*Primary Examiner*—Andy Huynh
(74) *Attorney, Agent, or Firm*—Ladas & Parry

(57) ABSTRACT

The present invention relates to a heat spreader and a semiconductor device package having the same. The semiconductor device package comprises a substrate, a semiconductor die, a plurality of bonding wires, a heat spreader, a molding compound and a plurality of solder bumps. The die is mounted on the top surface of the substrate. The bonding wires are used for electrically connecting the substrate and the semiconductor die, and each of the bonding wires has a highest portion. The heat spreader has at least one groove on a bottom surface thereof in the position corresponding to the highest portion of the bonding wires. The molding compound encapsulates the substrate, the semiconductor die and the heat spreader. As a result, the groove of the heat spreader can prevent the bonding wires from touching the heat spreader.

17 Claims, 4 Drawing Sheets

HEAT SPREADER AND SEMICONDUCTOR DEVICE PACKAGE HAVING THE SAME

BACKGROUND OF THE INVENTION

1. Field of the Invention

The present invention relates to a heat spreader and a semiconductor device package having the same, particularly to a heat spreader with at least one groove and a semiconductor device package having the same.

2. Description of the Related Art

FIG. 1 shows a cross sectional view of a conventional semiconductor device package 1. The conventional semiconductor device package 1 comprises a substrate 11, a semiconductor die 12, a plurality of bonding wires 13, a heat spreader 14, a molding compound 15 and a plurality of solder bumps 16. The substrate 11 has a top surface and a bottom surface. The semiconductor die 12 is mounted on the top surface of the substrate 11. The bonding wires 13 are used for electrically connecting the substrate 11 and the semiconductor die 12. The heat spreader 14 comprises a heat spreader body 141 and a supporting portion 142. The heat spreader body 141 is a plane and its top surface is a surface that is exposed to the air for dissipating heat after being encapsulated.

The supporting portion 142 extends outwardly and downwardly from the outermost edge of the heat spreader body 141 and is in contact with the top surface of the substrate 11 so as to form a cavity to accommodate the semiconductor die 12 and the bonding wires 13. The molding compound 15 encapsulates the substrate 11, the semiconductor die 12, the bonding wires 13 and the heat spreader 14, but the top surface of the heat spreader body 141 is exposed to the air. The solder bumps 16 are formed on the bottom surface of the substrate 11 and the semiconductor die 12 is electrically connected to an outer circuit (not shown) by the solder bumps 16.

A shortcoming of the conventional semiconductor device package 1 is, described as follows. Because each of the bonding wires 13 is a bending curve, whose turning portion is a highest portion 131. When the semiconductor die 12 is relative high or the supporting portion 142 of the heat spreader 14 is relative low, the bottom surface of the heat spreader body 141 will touch the highest portion 131 of the bonding wire 13 easily causing a short circuit, or the downward force of the heat spreader 14 against the bonding wire will break the connection between the bonding wire 13 and the semiconductor die 12 or the substrate 11 so as to cause open circuit.

Consequently, there is an existing need for a novel and improved heat spreader and package structure to solve the above-mentioned problem.

SUMMARY OF THE INVENTION

One objective of the present invention is to provide a heat spreader having at least one groove on the bottom surface thereof in the position corresponding to the highest portion of the bonding wires to prevent the bonding wires from touching the heat spreader.

Another objective of the present invention is to provide a semiconductor device package comprising a substrate, a semiconductor die, a plurality of bonding wires, a heat spreader, a molding compound and a plurality of conductive elements. The semiconductor die is mounted on the top surface of the substrate. The bonding wires are used for electrically connecting the substrate and the semiconductor die. Each of the bonding wires has a highest portion.

The heat spreader comprises a heat spreader body and a supporting portion. The heat spreader body has at least one groove on the bottom surface thereof in the position corresponding to the highest portion of the bonding wires to prevent the bonding wires from touching the heat spreader body. The supporting portion extends outwardly and downwardly from the heat spreader body to form a cavity to accommodate the semiconductor die and the bonding wires.

The molding compound is used for encapsulating the substrate, the semiconductor die, the bonding wires and the heat spreader, wherein the top side of the heat spreader body is exposed to the air. The conductive elements are formed on the bottom surface of the substrate and are used for being electrically connected to an outer circuit.

DETAILED DESCRIPTION OF THE INVENTION

Figure 1:
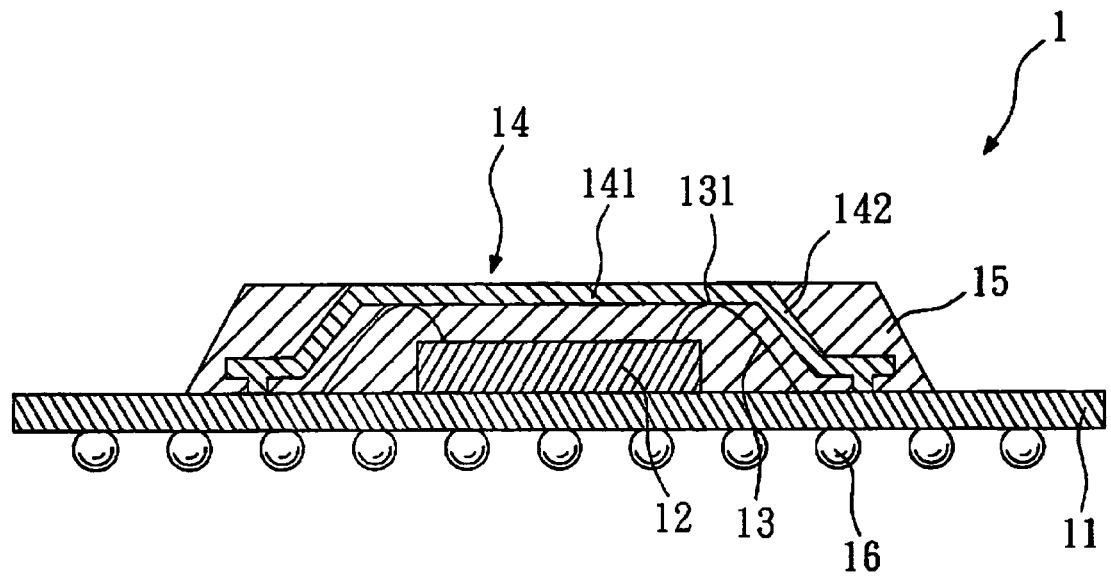
FIG. 1 shows a cross sectional view of a conventional semiconductor device package.
Figure 2:
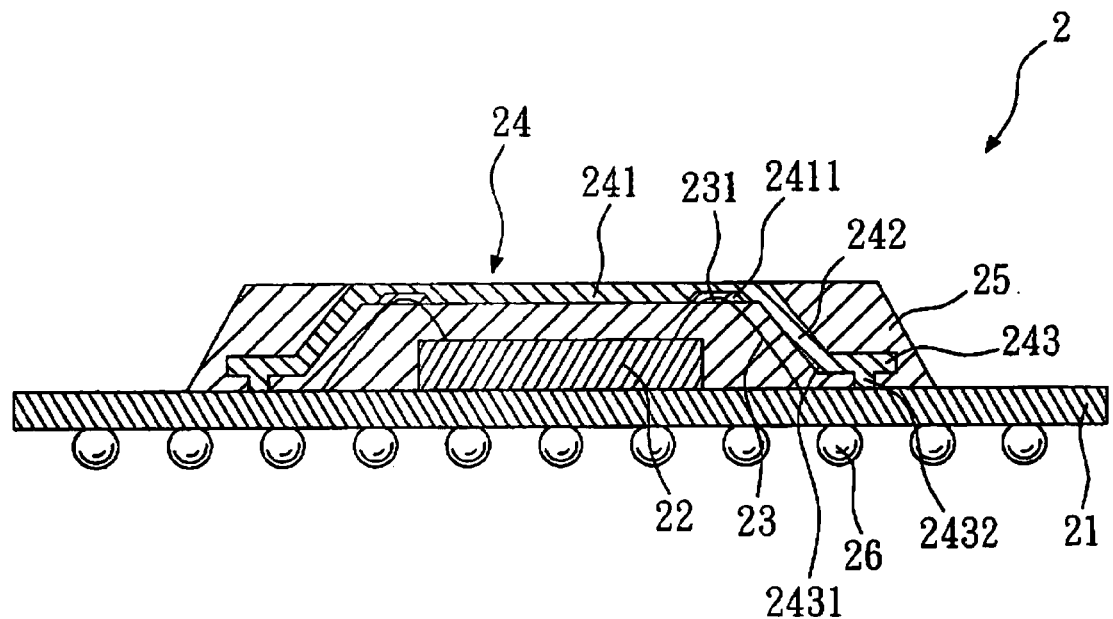
FIG. 2 shows a cross sectional view of a semiconductor device package according to a first embodiment of the present invention.

FIG. 2 shows a cross sectional view of a semiconductor device package according to the first embodiment of the present, invention. The package 2 comprises a substrate 21, a semiconductor die 22, a plurality of bonding wires 23, a heat spreader 24, a molding compound 25 and a plurality of conductive elements 26.

The substrate 21 has a top surface and a bottom surface. The semiconductor die 22 is mounted on the top surface of the substrate 21. The bonding wires 23 are used for electrically connecting the substrate 21 and the semiconductor die 22. Each of the bonding wires 23 is a bending curve, whose turning portion is a highest portion 231. In this embodiment, the bonding wires 23 are gold wires.

The heat spreader 24 accommodates the semiconductor die 22 and the bonding wires 23. The molding compound 25 encapsulates the substrate 21, the semiconductor die 22, the bonding wires 23 and the heat spreader 24, wherein the top side of the heat spreader 24 is exposed to the air. The conductive elements 26 are formed on the bottom surface of the substrate 21. The semiconductor die 22 is electrically connected to an outer circuit (not shown) by the conductive elements 26. In this embodiment, the conductive elements 26 are solder bumps.

Figure 3:
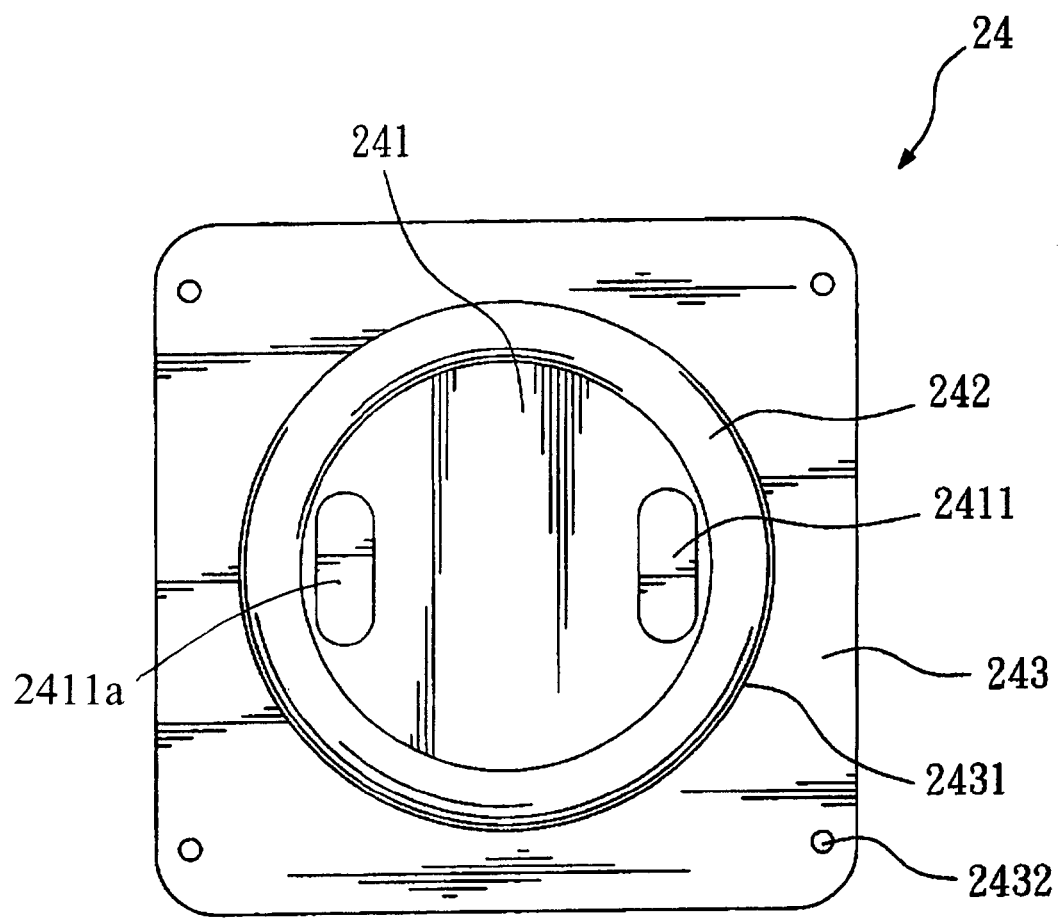
FIG. 3 shows a bottom view of the heat spreader according to the first embodiment of the present invention.

FIG. 3 shows a bottom view of the heat spreader 24 according to the first embodiment of the present invention. The heat spreader 24 comprises a heat spreader body 241, a supporting portion 242 and an annular base 243. The heat spreader body 241 is a plate structure having a top surface and a bottom surface. The top surface of the heat spreader body 241 matches with the upper mold (not shown) and is exposed to the air after being encapsulated so as to be a heat dissipation path. The bottom surface of the heat spreader body 241 has a plurality of grooves 2411, 2411a in the positions corresponding to the highest portions of the bonding wires, e.g., portion 231 of the bonding wire 23 to prevent the bonding wire 23 from touching the heat spreader body 241. In the present invention, the grooves 2411, 2411a are independent, that is the grooves 2411, 2411a do not connect to each other. In this embodiment, there are two independent grooves 2411, 2411a and each groove 2411, 2411a is in a strip configuration in the bottom view of FIG. 3. Also in this embodiment, at least the groove 2411 is a blind hole which is not through the heat spreader body 241 to avoid reducing the heat dissipation efficiency. Alternatively, the groove 2411 may be a through hole. In this embodiment, the cross sections of the groove 2411 is trapezoid. Alternatively, the cross section of the groove 2411 may be rectangular, triangular, semicircular or of other shapes.

Referring to FIGS. 2 and 3, the supporting portion 242 extends outwardly and downwardly from the heat spreader body 241 and is in contact with the top surface of the substrate 21 to form a cavity to accommodate the semiconductor die 22 and the bonding wires 23.

The annular base 243 is a plate structure that has an opening defined by an inner rim 2431. The bottom of the supporting portion 242 is connected to the inner rim 2431. However, in other application, the bottom of the supporting portion 242 is connected to the upper surface of the annular base 243, not the inner rim 2431. The annular base 243 has a plurality of protrusions 2432 on the bottom surface thereof, and the protrusions 2432 are in contact with the top surface of the substrate 21.

Figure 4:
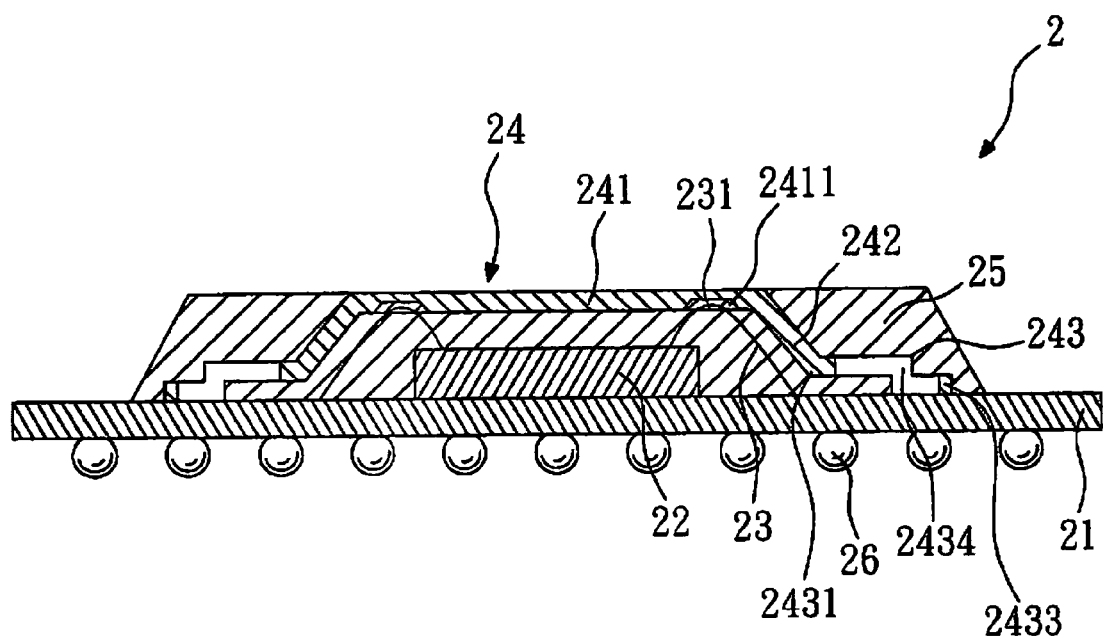
FIG. 4 shows a cross sectional view of a semiconductor device package according to a second embodiment of the present invention.

FIG. 4 shows a cross sectional view of a semiconductor device package according to the second embodiment of the present invention. This embodiment is substantially equal to the first embodiment, except that the shape of the protrusion 2433 of the annular base 243 differs. In this embodiment, the protrusion 2433 extends outwardly and downwardly from the outer rim of the annular base 243 so as to form a step configuration and is in contact with the top surface of the substrate 21.

Figure 5:
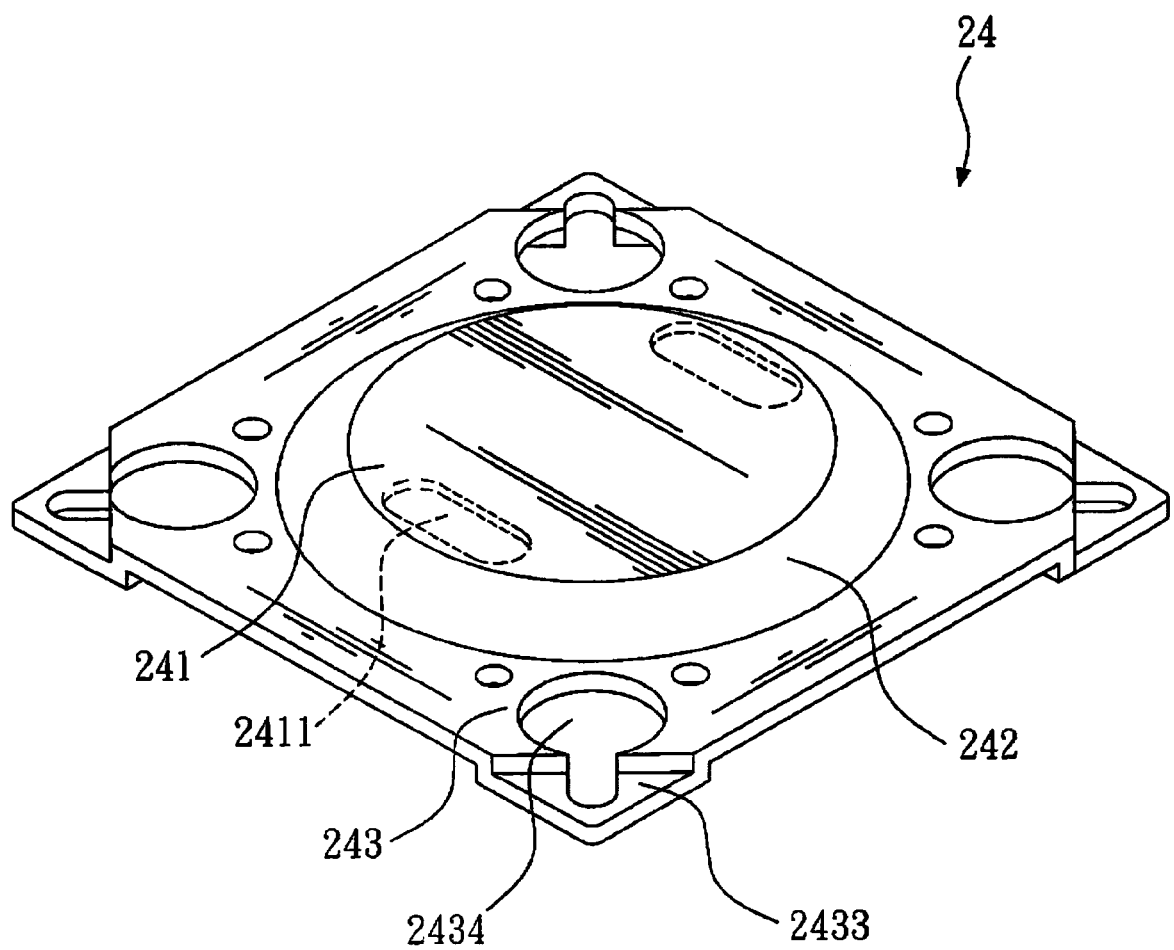
FIG. 5 shows a perspective view of the heat spreader according to the second embodiment of the present invention.

FIG. 5 shows a perspective view of the heat spreader according to the second embodiment of the present invention. As shown in the figure, the protrusion 2433 has an opening 2434 so that the molding compound 25 can flow smoothly during the molding process.

While several embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications which maintain the spirit and scope of the present invention are within the scope as defined in the appended claims.

What is claimed is:

1. A semiconductor device package comprising:
a substrate having a top surface and a bottom surface;
a semiconductor die mounted on the top surface of the substrate;
a plurality of bonding wires used for electrically connecting the substrate and the semiconductor die, each of the bonding wires having a highest portion;
a heat spreader comprising a heat spreader body, a supporting portion and an annular base, wherein the heat spreader body has at least one groove on a bottom surface thereof in the position corresponding to the highest portion of the bonding wires to prevent the bonding wires from touching the heat spreader body, the supporting portion extends outwardly and downwardly from the heat spreader body to form a cavity to accommodate the semiconductor die and the bonding wires, and the annular base has an opening, a bottom surface, a plurality of protrusions and an outer rim, the opening is defined by an inner rim, a bottom of the supporting portion is connected to the annular base, the protrusions are on the bottom surface of the annular base and are in contact with the top surface of the substrate, the protrusions extend outwardly and downwardly from the outer rim of the annular base so as to form a step configuration; and
a molding compound used for encapsulating the substrate, the semiconductor die, the bonding wires and the heat spreader, wherein a top side of the heat spreader body is exposed.

2. The package according to claim 1, wherein the heat spreader body is a plate structure.

3. The package according to claim 1, wherein each of the protrusions has an opening.

4. The package according to claim 1, further comprising a plurality of conductive elements formed on the bottom surface of the substrate and used for being electrically connected to an outer circuit.

5. The package according to claim 4, wherein the conductive elements are solder bumps.

6. The package according to claim 1, wherein the bonding wires are gold wires.

7. The package according to claim 1, wherein the cross section of the groove is rectangular in shape.

8. The package according to claim 1, wherein the cross section of the groove is triangular in shape.

9. The package according to claim 1, wherein the cross section of the groove is trapezoid in shape.

10. The package according to claim 1, wherein the cross section of the groove is semicircular in shape.

11. The package according to claim 1, wherein the groove is a blind hole.

12. A heat spreader used for a semiconductor device package having a plurality of bonding wires used for electrically connecting a substrate and a semiconductor die, each of the bonding wires having a highest portion, the heat spreader comprising:
a heat spreader body having at least one groove on a bottom surface thereof in the position corresponding to the highest portion of the bonding wires to prevent the bonding wires from touching the heat spreader body;
a supporting portion extending outwardly and downwardly from the heat spreader body to form a cavity to accommodate the semiconductor die and the bonding wires; and
an annular base having an opening, a bottom surface, a plurality of protrusions and an outer rim, wherein the opening is defined by an inner rim, a bottom of the supporting portion is connected to the annular base, and the protrusions are on the bottom surface of the annular base, in contact with the top surface of the substrate, the protrusions and extend outwardly and downwardly from the outer rim of the annular base so as to form a step configuration.

13. The heat spreader according to claim 12, wherein the heat spreader body is a plate structure.

14. The heat spreader according to claim 12, wherein each of the protrusions has an opening.

15. The heat spreader according to claim 12, wherein the cross section of the groove is rectangular in shape.

16. The heat spreader according to claim 12, wherein the cross section of the groove is semicircular in shape.

17. The heat spreader according to claim 12, wherein the groove is a blind hole.

* * * * *